(12) United States Patent
Kumar et al.

(10) Patent No.: US 7,909,961 B2
(45) Date of Patent: *Mar. 22, 2011

(54) METHOD AND APPARATUS FOR PHOTOMASK PLASMA ETCHING

(75) Inventors: Ajay Kumar, Cupertino, CA (US); Madhavi R. Chandrachood, Sunnyvale, CA (US); Richard Lewington, Hayward, CA (US); Darin Bivens, San Mateo, CA (US); Amitabh Sabharwal, San Jose, CA (US); Sheeba J. Panayil, Santa Clara, CA (US); Alan Hiroshi Ouye, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 876 days.

This patent is subject to a terminal disclaimer.

(21) Appl. No.: 11/554,495

(22) Filed: Oct. 30, 2006

(65) Prior Publication Data

US 2008/0099426 A1    May 1, 2008

(51) Int. Cl.
*C23C 16/00* (2006.01)
*C23F 1/00* (2006.01)
*H01L 21/00* (2006.01)

(52) U.S. Cl. ......... 156/345.3; 156/345.33; 156/345.34; 156/345.35; 156/345.43; 118/723 E; 118/723 I; 118/723 IR; 118/723 MW; 118/723 ER; 118/723 ME

(58) Field of Classification Search ............... 156/345.3, 156/345.33–345.35, 345.43; 118/723 E, 118/723 I, 723 MW, 723 ME, 723 ER, 723 IR, 118/715

See application file for complete search history.

(56) References Cited

U.S. PATENT DOCUMENTS

| | | | |
|---|---|---|---|
| 4,496,420 A | 1/1985 | Frohlich et al. |
| 4,600,464 A | 7/1986 | Desilets et al. |
| 5,024,748 A | 6/1991 | Fujimura |
| 5,075,256 A | 12/1991 | Wang et al. |
| 5,556,500 A | 9/1996 | Hasegawa et al. |
| 5,593,540 A | 1/1997 | Tomita et al. |
| 5,605,637 A | 2/1997 | Shan et al. |
| 5,614,026 A | 3/1997 | Williams |
| 5,673,922 A | 10/1997 | Sherstinsky et al. |
| 5,972,781 A | 10/1999 | Wegleiter et al. |
| 6,129,808 A | 10/2000 | Wicker et al. |
| 6,167,835 B1 | 1/2001 | Ootera et al. |

(Continued)

FOREIGN PATENT DOCUMENTS

EP        0488393 A2    6/1992

(Continued)

OTHER PUBLICATIONS

Partial European Search Report dated Jan. 30, 2008 for International Application No. 07020931.7.

(Continued)

*Primary Examiner* — Parviz Hassanzadeh
*Assistant Examiner* — Rakesh Dhingra
(74) *Attorney, Agent, or Firm* — Patterson & Sheridan, LLP

(57) ABSTRACT

A method and apparatus for etching photomasks are provided herein. The apparatus includes a process chamber with a shield above a substrate support. The shield comprises a plate with apertures, and the plate has two zones with at least one characteristic, such as material or potential bias, that is different from each other. The method provides for etching a photomask substrate with a distribution of ions and neutral species that pass through the shield.

4 Claims, 6 Drawing Sheets

U.S. PATENT DOCUMENTS

| | | |
|---|---|---|
| 6,190,496 B1 | 2/2001 | DeOrnellas et al. |
| 6,203,657 B1 | 3/2001 | Collison et al. |
| 6,261,406 B1 | 7/2001 | Jurgensen et al. |
| 6,270,687 B1 | 8/2001 | Ye et al. |
| 6,287,643 B1 | 9/2001 | Powell et al. |
| 6,290,806 B1 | 9/2001 | Donohoe |
| 6,299,689 B1 | 10/2001 | Wang et al. |
| 6,306,244 B1 | 10/2001 | Kennedy et al. |
| 6,335,293 B1 | 1/2002 | Luo et al. |
| 6,339,206 B1 | 1/2002 | Johnson |
| 6,364,949 B1 | 4/2002 | Or et al. |
| 6,375,748 B1 | 4/2002 | Yudovsky et al. |
| 6,514,378 B1 | 2/2003 | Ni et al. |
| 6,521,010 B1 | 2/2003 | Katata |
| 6,521,292 B1 | 2/2003 | Yudovsky et al. |
| 6,551,447 B1 | 4/2003 | Savas et al. |
| 6,553,332 B2 | 4/2003 | Leng |
| 6,589,352 B1 | 7/2003 | Yudovsky et al. |
| 6,656,322 B2 | 12/2003 | Hongo et al. |
| 6,676,800 B1 | 1/2004 | Festa et al. |
| 6,676,803 B2 | 1/2004 | Kim |
| 6,692,649 B2 | 2/2004 | Collison et al. |
| 6,782,843 B2 | 8/2004 | Kinnard et al. |
| 6,805,779 B2 | 10/2004 | Chistyakov |
| 6,806,651 B1 | 10/2004 | Chistyakov |
| 6,806,949 B2 | 10/2004 | Ludviksson et al. |
| 6,837,966 B2 | 1/2005 | Nishimoto et al. |
| 6,868,800 B2 | 3/2005 | Moroz |
| 6,872,259 B2 | 3/2005 | Strang |
| 6,926,802 B2 | 8/2005 | Lee |
| 6,949,165 B2 | 9/2005 | Koshimizu |
| 7,037,846 B2 | 5/2006 | Srivastava et al. |
| 7,241,345 B2 | 7/2007 | Ramamurthy et al. |
| 7,609,002 B2 | 10/2009 | Lee |
| 2002/0033233 A1 | 3/2002 | Savas |
| 2002/0121501 A1 | 9/2002 | Choquette et al. |
| 2002/0142612 A1 | 10/2002 | Wu et al. |
| 2002/0185229 A1 | 12/2002 | Brcka et al. |
| 2002/0189762 A1 | 12/2002 | Kim |
| 2003/0010448 A1 | 1/2003 | Lee |
| 2003/0019580 A1 | 1/2003 | Strang et al. |
| 2003/0047536 A1 | 3/2003 | Johnson |
| 2003/0089680 A1 | 5/2003 | Johnson et al. |
| 2003/0094643 A1 | 5/2003 | Yang |
| 2003/0194510 A1 | 10/2003 | Nguyen et al. |
| 2003/0209324 A1 | 11/2003 | Fink |
| 2003/0217812 A1 | 11/2003 | Yoshiki et al. |
| 2004/0000535 A1 | 1/2004 | Mueller et al. |
| 2004/0003780 A1 | 1/2004 | Yudovsky et al. |
| 2004/0031565 A1 | 2/2004 | Su et al. |
| 2004/0035532 A1 | 2/2004 | Jung |
| 2004/0069227 A1 | 4/2004 | Ku et al. |
| 2004/0079725 A1 | 4/2004 | Inomata et al. |
| 2004/0083975 A1 | 5/2004 | Tong et al. |
| 2004/0129226 A1 | 7/2004 | Strang et al. |
| 2004/0140853 A1 | 7/2004 | Cyrusian |
| 2004/0192043 A1 | 9/2004 | Makita et al. |
| 2004/0212312 A1 | 10/2004 | Chistyakov |
| 2004/0219737 A1 | 11/2004 | Quon |
| 2004/0250772 A1 | 12/2004 | Ramamurthy et al. |
| 2004/0261718 A1 | 12/2004 | Kim et al. |
| 2005/0006344 A1 | 1/2005 | Tanaka |
| 2005/0011447 A1 | 1/2005 | Fink |
| 2005/0066902 A1 | 3/2005 | Fink |
| 2005/0087302 A1 | 4/2005 | Mardian et al. |
| 2005/0133164 A1 | 6/2005 | Fischer et al. |
| 2005/0139317 A1 | 6/2005 | Wu et al. |
| 2005/0241583 A1* | 11/2005 | Buechel et al. ........... 118/723 E |
| 2005/0241767 A1 | 11/2005 | Ferris et al. |
| 2005/0263070 A1 | 12/2005 | Fink |
| 2005/0284370 A1 | 12/2005 | Strang |
| 2006/0000802 A1 | 1/2006 | Kumar et al. |
| 2006/0000805 A1 | 1/2006 | Todorow et al. |
| 2006/0060303 A1 | 3/2006 | Fink et al. |
| 2006/0213865 A1 | 9/2006 | Honda et al. |
| 2006/0260747 A1 | 11/2006 | Hirose et al. |
| 2007/0000614 A1 | 1/2007 | Hatamura et al. |
| 2007/0015504 A1 | 1/2007 | Kusuda et al. |
| 2007/0017898 A1 | 1/2007 | Kumar et al. |
| 2007/0044719 A1 | 3/2007 | Ku et al. |
| 2008/0072823 A1 | 3/2008 | Yudovsky et al. |
| 2008/0099431 A1 | 5/2008 | Kumar et al. |
| 2008/0101978 A1 | 5/2008 | Ryabova et al. |

FOREIGN PATENT DOCUMENTS

| | | |
|---|---|---|
| EP | 0496564 A1 | 7/1992 |
| EP | 0522296 A2 | 1/1993 |
| EP | 0 702 392 A | 3/1996 |
| EP | 0930642 A1 | 7/1999 |
| EP | 1024520 A2 | 8/2000 |
| EP | 1355342 A2 | 10/2003 |
| EP | 1 612 840 A | 1/2006 |
| EP | 1612840 A2 | 1/2006 |
| EP | 1686421 A2 | 8/2006 |
| JP | 62299031 A | 12/1987 |
| JP | 02-184029 A | 7/1990 |
| JP | 08-148473 A | 6/1996 |
| JP | 9115836 A | 5/1997 |
| JP | 11067727 A | 3/1999 |
| JP | 2004165298 A | 6/2004 |
| KR | 20010039233 A | 5/2001 |
| KR | 013170 | 2/2004 |
| KR | 2005-0067405 A | 7/2005 |
| KR | 2006-0048674 A | 5/2006 |
| TW | 502290 B | 9/2002 |
| WO | WO-9850600 A1 | 11/1998 |
| WO | WO-03/036704 A1 | 5/2003 |
| WO | WO-03/054912 A1 | 7/2003 |
| WO | WO03054912 A1 | 7/2003 |
| WO | 2007/015504 A | 2/2007 |
| WO | WO-2007/015504 | 2/2007 |

OTHER PUBLICATIONS

Extended European Search Report for EP 07020930.9 mailed Feb. 28, 2008.

Extended European Search Report for EP 07020931.7 mailed Apr. 18, 2008.

European Search Report of EP 07 02 0931, dated Apr. 18, 2008, consists of nine unnumbered pages.

Official Letter dated Jun. 24, 2009 from Korean Patent Office for corresponding Korean Patent application 10-2007-0086473. A Concise Statement of Relevance is provided.

Official Letter dated Jun. 23, 2009 fro Korean Patent Office for corresponding Korean Patent application 10-2007-0086475. A Concise Statement of Relevance is provided.

Notice to File a Response for Korean Patent Application No. 10-2007-0086475 dated Dec. 24, 2009.

Extended Search Report for corresponding European Patent Application No. 07020931.7 dated Apr. 18, 2008.

European Patent Office Communication pursuant to Rule 69 EPC dated May 27, 2008 for corresponding Patent Application No. 07020931.7.

Notice to File a Response from the Korean Intellectual Property Office dated Dec. 11, 2008 for corresponding Korean Patent Application No. 10-2007-0086473. A Concise Statement of Relevance is provided.

Chinese First Office Action dated Apr. 29, 2010 for Chinese Application No. 200710143238.X. (Appm/011454CN02).

Prosecution history of U.S. Appl. No. 10/882,084, as of Sep. 7, 2010.

Prosecution history of U.S. Appl. No. 10/880,754, as of Sep. 7, 2010.

Prosecution history of U.S. Appl. No. 11/530,659, as of Sep. 7, 2010.

Prosecution history of U.S. Appl. No. 11/554,502, as of Sep. 7, 2010.

Official Letter dated Sep. 1, 2010, from Taiwan Patent Office for corresponding Taiwan Patent application No., 95146522.

Official Letter dated Aug. 9, 2010, from Taiwan Patent Office for corresponding Taiwan Patent application No., 95146522.

* cited by examiner

METHOD AND APPARATUS FOR PHOTOMASK PLASMA ETCHING

CROSS-REFERENCE TO RELATED APPLICATIONS

The subject matter of this application is related to the subject matter disclosed in U.S. patent application Ser. No. 10/880,754, entitled "METHOD AND APPARATUS FOR QUASI-REMOTE PLASMA ETCHING", filed on Jun. 30, 2004, by Todorow, et al., and in U.S. patent application Ser. No. 10/882,084, entitled "METHOD AND APPARATUS FOR PHOTOMASK PLASMA ETCHING", filed on Jun. 30, 2004, by Kumar, et al., and in U.S. patent application Ser. No. 11/554,502, entitled "METHOD AND APPARATUS FOR QUASI-REMOTE PLASMA ETCHING", filed concurrently herewith, by Ouye, et al., all of which are hereby incorporated herein by reference in their entireties.

BACKGROUND OF THE INVENTION

1. Field of the Invention

Embodiments of the present invention generally relate to a method and apparatus for plasma etching photomasks and, more specifically, to a method and apparatus with improved control of distribution of plasma species.

2. Description of the Related Art

The fabrication of microelectronics or integrated circuit devices typically involves a complicated process sequence requiring hundreds of individual steps performed on semiconductive, dielectric and conductive substrates. Examples of these process steps include oxidation, diffusion, ion implantation, thin film deposition, cleaning, etching and lithography. Using lithography and etching (often referred to as pattern transfer steps), a desired pattern is first transferred to a photosensitive material layer, e.g., a photoresist, and then to the underlying material layer during subsequent etching. In the lithographic step, a blanket photoresist layer is exposed to a radiation source through a reticle or photomask containing a pattern so that an image of the pattern is formed in the photoresist. By developing the photoresist in a suitable chemical solution, portions of the photoresist are removed, thus resulting in a patterned photoresist layer. With this photoresist pattern acting as a mask, the underlying material layer is exposed to a reactive environment, e.g., using wet or dry etching, which results in the pattern being transferred to the underlying material layer.

The pattern on a photomask, which is typically formed in a metal-containing layer supported on a glass or quartz substrate, is also generated by etching through a photoresist pattern. In this case, however, the photoresist pattern is created by a direct write technique, e.g., with an electron beam or other suitable radiation beam, as opposed to exposing the photoresist through a reticle. With the patterned photoresist as a mask, the pattern can be transferred to the underlying metal-containing layer using plasma etching. An example of a commercially available photomask etch equipment suitable for use in advanced device fabrication is the Tetra™ Photomask Etch System, available from Applied Materials, Inc., of Santa Clara, Calif. The terms "mask", "photomask" or "reticle" will be used interchangeably to denote generally a substrate containing a pattern.

With ever-decreasing device dimensions, the design and fabrication of photomasks for advanced technology becomes increasingly complex, and control of critical dimensions and process uniformity becomes increasingly more important. Therefore, there is an ongoing need for improved process monitor and control in photomask fabrication.

SUMMARY OF THE INVENTION

The present invention generally provides a method and apparatus for etching photomasks. One embodiment of the invention provides an apparatus for plasma etching, comprising a process chamber, a support pedestal disposed in the process chamber and adapted to receive a photomask, an RF power source for forming a plasma within the chamber, a shield disposed in the chamber above the pedestal, the shield comprising a plate having a plurality of apertures and configured to control the distribution of charged and neutral species passing through the plate, wherein the plate comprises two zones having at least one characteristic—that of material or potential bias, being different from each other.

Another embodiment of the invention provides a method of etching a photomask. The method comprises providing a process chamber having a support pedestal; providing a shield above the support pedestal, the shield comprising a plate having a first zone and a second zone each comprising a plurality of apertures and configured to control a distribution of charged and neutral species passing through the plate, the first zone having at least one characteristic—that of material or potential bias, being different from the second zone, placing a photomask upon the pedestal, introducing a process gas into the process chamber, forming a plasma from the process gas, and etching the photomask with ions and neutral species that pass through the plate.

Another embodiment of the invention provides an apparatus for plasma etching. The apparatus comprises a process chamber, a support pedestal disposed in the process chamber and adapted to receive a photomask, an RF power source for forming a plasma within the chamber, an RF power source for forming a plasma within the chamber, and a shield disposed in the chamber above the pedestal, the shield comprising a plate having a plurality of apertures and configured to control the distribution of charged and neutral species passing through the plate, wherein the plate comprises a material selected from the group consisting of yttria and a material having a dielectric constant higher than about 4.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for improving the etching of a photomask substrate. More specifically, the invention relates to an improved shield for controlling the spatial distribution of charged and neutral species in a plasma etch chamber. This shield is also referred to as an ion-radical or ion-neutral shield.

One example of an ion-radical shield for use in a plasma etch chamber has previously been disclosed in U.S. patent application Ser. No. 10/880,754, entitled "METHOD AND APPARATUS FOR PHOTOMASK PLASMA ETCHING", filed on Jun. 30, 2004, by Kumar, et al., which is herein incorporated by reference in its entirety.

Figure 1:
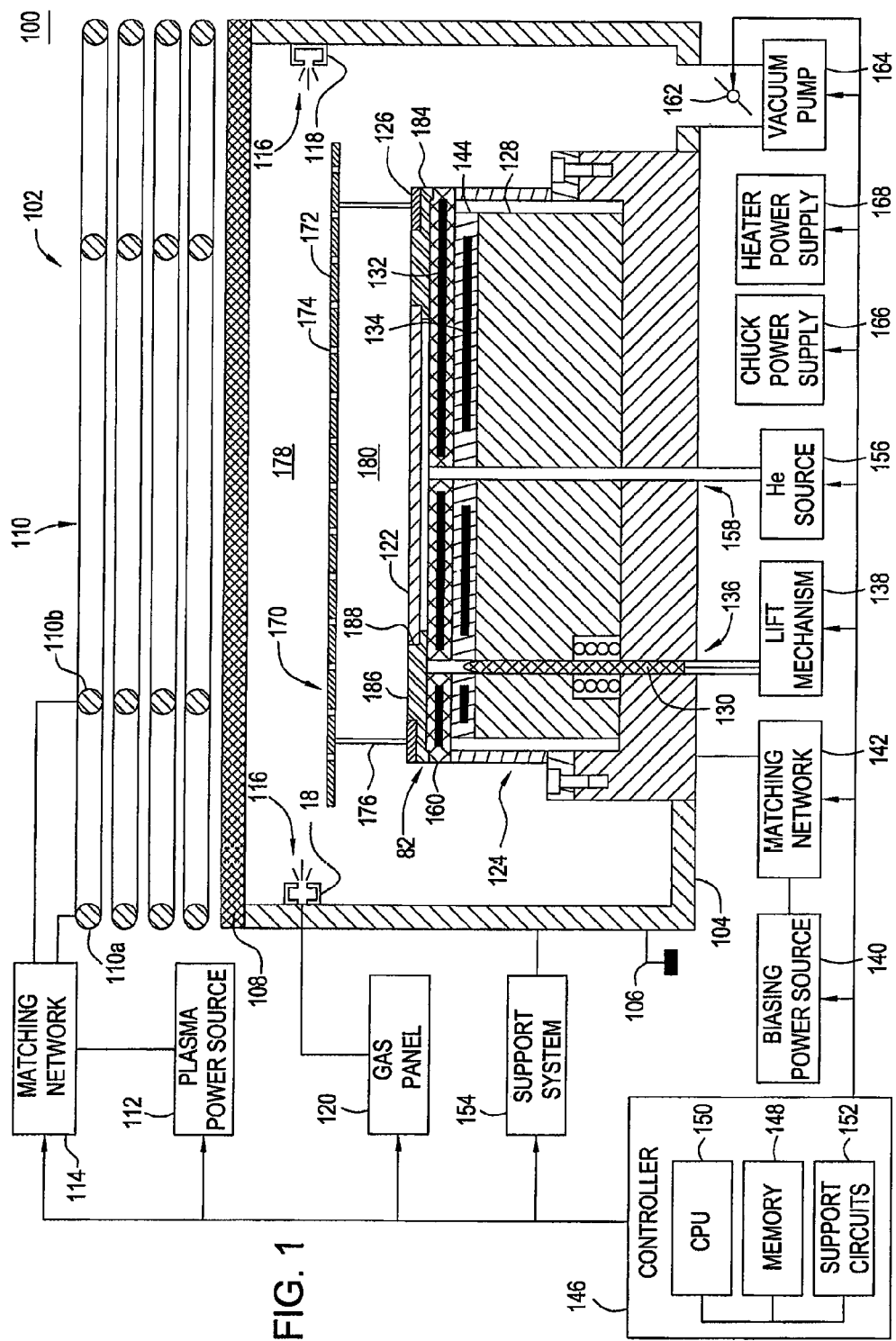
FIG. 1 is a schematic diagram of an etch reactor having a shield.

FIG. 1 depicts a schematic diagram of an etch reactor 100 having an ion-radical shield 170. Suitable reactors that may be adapted for use with the teachings disclosed herein include, for example, the Decoupled Plasma Source (DPS®) II reactor, or the Tetra I and Tetra II Photomask etch systems, all of which are available from Applied Materials, Inc. of Santa Clara, Calif. The particular embodiment of the reactor 100 shown herein is provided for illustrative purposes and should not be used to limit the scope of the invention. It is contemplated that the invention may be utilized in other plasma processing chambers, including those from other manufacturers.

The reactor 100 generally comprises a process chamber 102 having a substrate pedestal 124 within a conductive body (wall) 104, and a controller 146. The chamber 102 has a substantially flat dielectric ceiling or lid 108. Other modifications of the chamber 102 may have other types of ceilings, e.g., a dome-shaped ceiling. An antenna 110 is disposed above the ceiling 108 and comprises one or more inductive coil elements that may be selectively controlled (two co-axial elements 110a and 110b are shown in FIG. 1). The antenna 110 is coupled through a first matching network 114 to a plasma power source 112, which is typically capable of producing up to about 3000 W at a tunable frequency in a range from about 50 kHz to about 13.56 MHz.

The substrate pedestal (cathode) 124 is coupled through a second matching network 142 to a biasing power source 140. The biasing source 140 generally is a source of up to about 500 W at a frequency of approximately 13.56 MHz that is capable of producing either continuous or pulsed power. Alternatively, the source 140 may be a DC or pulsed DC source.

In one embodiment, the substrate support pedestal 124 comprises an electrostatic chuck 160, which has at least one clamping electrode 132 and is controlled by a chuck power supply 166. In alternative embodiments, the substrate pedestal 124 may comprise substrate retention mechanisms such as a susceptor clamp ring, a mechanical chuck, and the like.

A reticle adapter 182 is used to secure the substrate (e.g., mask or reticle) 122 onto the substrate support pedestal 124. The reticle adapter 182 generally includes a lower portion 184 that covers an upper surface of the pedestal 124 (for example, the electrostatic chuck 160) and a top portion 186 having an opening 188 that is sized and shaped to hold the substrate 122. The opening 188 is generally substantially centered with respect to the pedestal 124. The adapter 182 is generally formed from a single piece of etch resistant, high temperature resistant material such as polyimide ceramic or quartz. An edge ring 126 may cover and/or secure the adapter 182 to the pedestal 124.

A lift mechanism 138 is used to lower or raise the adapter 182, and hence, the substrate 122, onto or off of the substrate support pedestal 124. Generally, the lift mechanism 162 comprises a plurality of lift pins 130 (one lift pin is shown) that travel through respective guide holes 136.

In operation, the temperature of the substrate 122 is controlled by stabilizing the temperature of the substrate pedestal 124. In one embodiment, the substrate support pedestal 124 comprises a resistive heater 144 and a heat sink 128. The resistive heater 144 generally comprises at least one heating element 134 and is regulated by a heater power supply 168. A backside gas, e.g., helium (He), from a gas source 156 is provided via a gas conduit 158 to channels that are formed in the pedestal surface under the substrate 122 to facilitate heat transfer between the pedestal 124 and the substrate 122. During processing, the pedestal 124 may be heated by the resistive heater 144 to a steady-state temperature, which in combination with the backside gas, facilitates uniform heating of the substrate 122. Using such thermal control, the substrate 122 may be maintained at a temperature between about 0 and 350 degrees Celsius (0° C.).

An ion-radical shield 170 is disposed in the chamber 102 above the pedestal 124. The ion-radical shield 170 is electrically isolated from the chamber walls 104 and the pedestal 124 such that no ground path from the plate to ground is provided. One embodiment of the ion-radical shield 170 comprises a substantially flat plate 172 and a plurality of legs 176 supporting the plate 172. The plate 172, which may be made of a variety of materials compatible with process needs, comprises one or more openings (apertures) 174 that define a desired open area in the plate 172. This open area controls the amount of ions that pass from a plasma formed in an upper process volume 178 of the process chamber 102 to a lower process volume 180 located between the ion-radical shield 170 and the substrate 122. The greater the open area, the more ions can pass through the ion-radical shield 170. As such, the size of the apertures 174 controls the ion density in volume 180, and the shield 170 serves as an ion filter. The plate 172 may also comprise a screen or a mesh wherein the open area of the screen or mesh corresponds to the desired open area provided by apertures 174. Alternatively, a combination of a plate and screen or mesh may also be used.

During processing, a potential develops on the surface of the plate 172 as a result of electron bombardment from the plasma. The potential attracts ions from the plasma, effectively filtering them from the plasma, while allowing neutral species, e.g., radicals, to pass through the apertures 174 of the plate 172. Thus, by reducing the amount of ions through the ion-radical shield 170, etching of the mask by neutral species or radicals can proceed in a more controlled manner. This reduces erosion of the resist as well as sputtering of the resist onto the sidewalls of the patterned material layer, thus resulting in improved etch bias and critical dimension uniformity.

The present invention provides various enhancements to the ion-radical shield 170, including alternative materials and configurations. For example, using quartz or ceramics for the plate 172 may be beneficial over anodized aluminum, because it is believed that eddy currents may form in the aluminum plate and adversely affect process uniformity. In another embodiment, the plate 172 is made of a material having a dielectric constant greater than about 4. Examples of such materials include ceramics, e.g., alumina, yttria (yttrium oxide), and K140 (a proprietary material available from Kyocera), among others.

According to another embodiment of the invention, the ion-radical shield 170 comprises two zones or segments having at least one characteristic that is different from each other. For example, the shield may comprise a number of zones with different configurations including various geometries (e.g., sizes, shapes and open areas), and the zones may be made of the same or different materials, or be adapted to have different potential bias. By providing combinations of zone configurations, materials and/or potential bias, the spatial distribution of ions and neutrals in the plasma can be modified in a localized manner, allowing customization of process characteristics such as etch uniformity, or locally enhanced or reduced etch rates (e.g., to tailor to different pattern densities in different parts of a mask), and so on. Such a multi-zone shield, for example, can be used for active control of plasma species distribution, and thus, allow for enhanced process control.

In one embodiment, at least two zones of the shield are made of different materials having different dielectric constants. Suitable materials include a variety of ceramics (e.g., alumina, yttria), anodized aluminum, quartz, materials with dielectric constant higher than about 4, e.g., K140 available from Kyocera, as well as other materials compatible with process chemistries. In another embodiment, the shield is made primarily of one material, but is divided into different zones or segments that are physically separated or electrically isolated from each other. These zones are configured so that each can be independently biased to a different potential. Alternatively, the shield may comprise a plurality of zones having a combination of different geometric or spatial configurations, materials and/or potential biases.

Figure 2A:
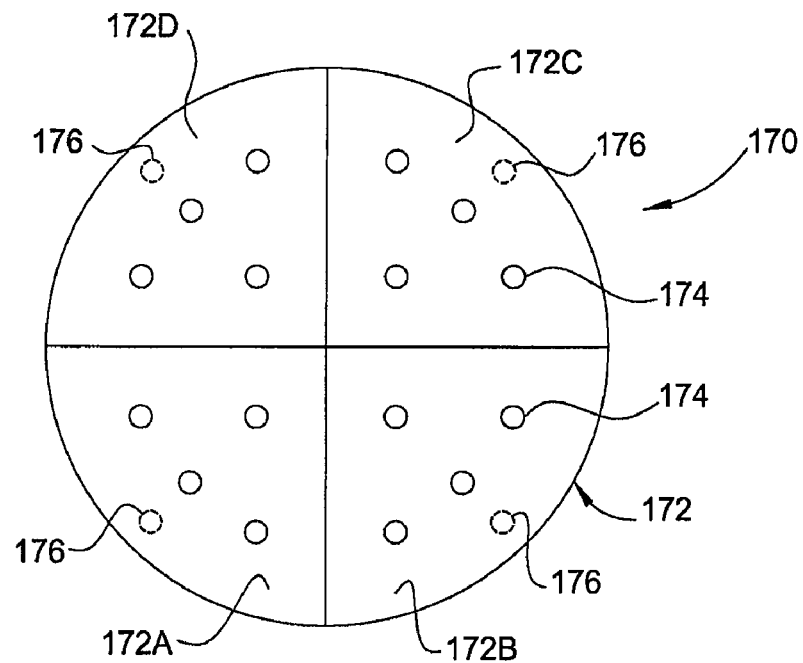
FIGS. 2A-B are schematic illustrations of the top views of two embodiments of the shield of FIG. 1.

FIG. 2A is a schematic illustration of a top view of one embodiment of the shield 170 of the present invention. In this embodiment, the shield 170 comprises a plate 172 having a plurality of apertures 174 and a plurality of legs 176. The plate 172 is divided into different zones or segments 172A, 172B, 172C and 172D. At least two of these zones are made of different materials such as ceramic (e.g., alumina or yttria), quartz, anodized aluminum, or other materials compatible with process chemistries. The use of materials having different dielectric constants allows one to tune the plasma characteristics, and thus, the etch results. For example, a zone made of a higher dielectric constant material will result in a larger charge build-up compared to another zone made of a lower dielectric constant material. Thus, more ions will pass through the zone with the lower dielectric constant material.

Figure 2B:
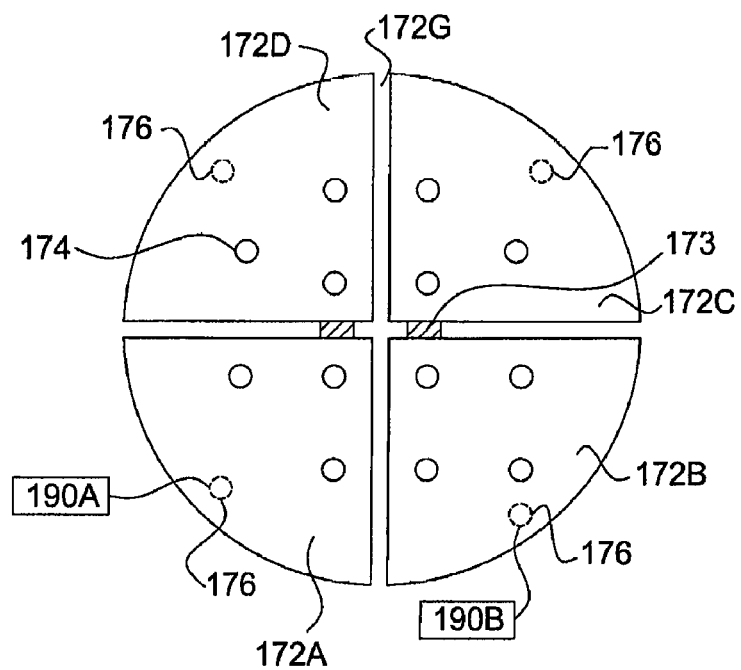
Figure 2C:
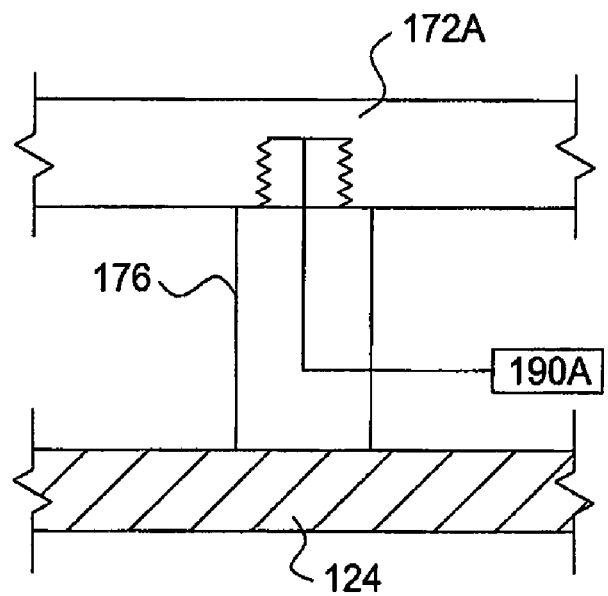
FIG. 2C is a schematic cross-sectional view of a portion of the shield.

Alternatively, all the zones may also be made of the same material, and adjacent zones may be separated from each other by a gap 172G or insulating material, as shown in FIG. 2B. In the configuration with a gap, adjacent zones may optionally be connected by one or more tabs 173 (made of a material different from the zones) to provide for mechanical stability, in addition to being supported by respective legs. Furthermore, one or more of the zones 172A, 172B, 172C and 172D may be connected to respective power sources for supplying a potential bias, which can be independently controlled for each zone. For example, zone 172A may be biased by power source 190A at a different potential from zone 172B, which is connected to another power source 190B. The power source connection is illustrated in FIG. 2C, which shows a cross-sectional view of zone 172A coupled to the substrate pedestal 124 by a leg 176. The electrical connection from the power source 190A is provided to the zone 172A from inside the leg 176. In general, either positive or negative bias voltages can be applied to one of more zones. In one embodiment, a DC bias voltage from about 0 volt to about 500 volt can be used. In other embodiments, a DC bias voltage from about 0 volt to about 100 volt, or from about 0 volt to about 20 volt, may be used.

For example, if a positive DC bias voltage is applied to the zone 172A, and adjacent zones 172B and 172D are not biased (e.g., floating), positive ions repelled from zone 172A will accumulate around zones 172B and 172D. This excess amount of positive ions, if not neutralized by the negative potentials built up from the electrons around zones 172B and 172D, will likely pass through the apertures 174 in these zones and contribute to the etching of the substrate 122. Thus, by selectively biasing one or more zones on the plate 172, the distribution of ions passing through the ion-neutral shield 170 can be varied in a controlled manner, resulting in corresponding changes in the etch results.

Figure 2D:
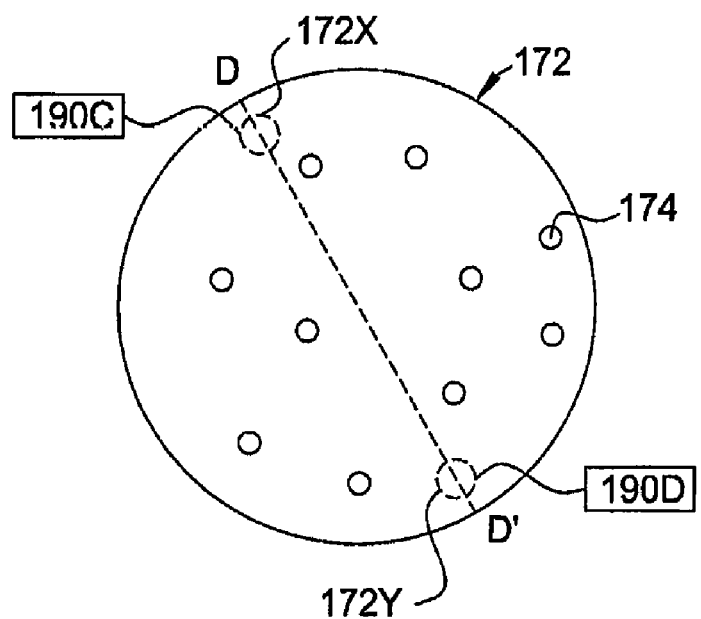
FIG. 2D is a schematic illustration of the top view of one embodiment showing a potential bias across the shield.

In yet another embodiment, the plate 172 comprises one material with a potential bias applied across two locations on the plate 172. In this embodiment, there is no gap or physical separation between the two zones of different potential bias around locations 172X and 172Y. This is illustrated in FIG. 2D, in which two voltage sources 190C and 190D are connected to provide a potential gradient between locations 172X and 172Y. In general, the potential gradient may be established across any two locations on the plate 172. In the embodiment of FIG. 2D, locations 172X, 172Y are disposed along diameter DD' near the perimeter, on opposite sides of the center of the plate. In another embodiment, the potential gradient may be applied between a first location near the center of the plate 172, and a second location near the perimeter of the plate 172. The distribution of ions and neutral species in the plasma passing through the apertures 174 of the plate 172 is modified by the potential gradient.

Figure 3A:
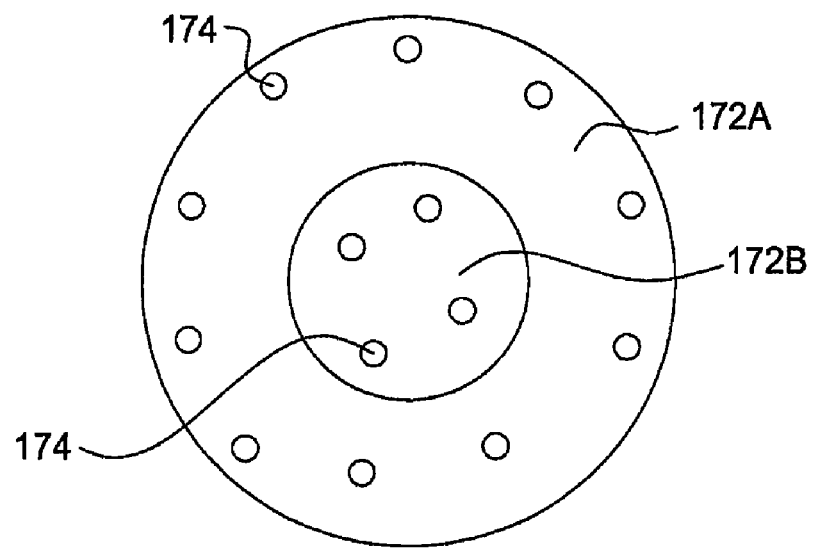
FIGS. 3A-B are schematic illustrations of the top views of two alternative embodiments of the shield.
Figure 3B:
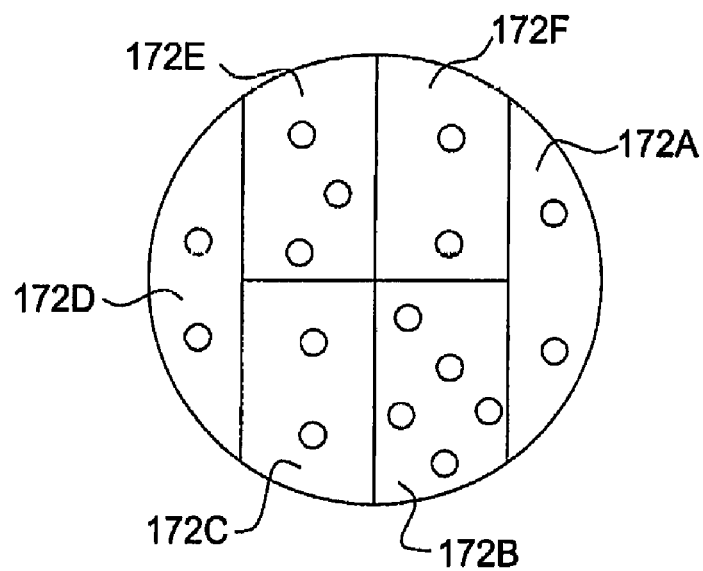

FIGS. 3A-B are schematic illustrations of the top views of two embodiments of the shield 170, showing different zones in various arrangements, e.g., 172A and 172B as concentric rings (FIG. 3A), and 172A, 172B, 172C, 172D, 172E and 172F in a grid or slice pattern (FIG. 3B). The concentric ring configuration, for example, may be useful in compensating for etch non-uniformities (in a radial direction) that may arise from non-uniform gas flow patterns in the chamber.

It is understood that each embodiment may be used in combination with each other, e.g., a plate, whether made of a single material or different materials, may comprise different zone configurations, or be provided with different potential bias across the plate.

In addition, the apertures 174 in different zones of the plate 172 may vary in size, spacing and geometric arrangement. The apertures 174 may generally have dimensions ranging from 0.03 inches (0.07 cm) to about 3 inches (7.62 cm), and may be arranged to define an open area within each zone of the plate 172 from about 2 percent to about 90 percent. It is contemplated that apertures 174 may be arranged in other geometric or random patterns and with various dimensions. The size, shape and patterning of the apertures 174 may vary depending upon the desired ion density in the lower process volume 180. For example, more apertures of small diameters in a particular zone of the plate 172 may be used to increase the radical (or neutral) to ion density ratio in a corresponding region of the volume 180. Alternatively, a number of larger apertures may be interspersed with small apertures within a zone of the plate 172 to increase the ion to radical (or neutral) density ratio in a corresponding region of the volume 180.

Figure 4:
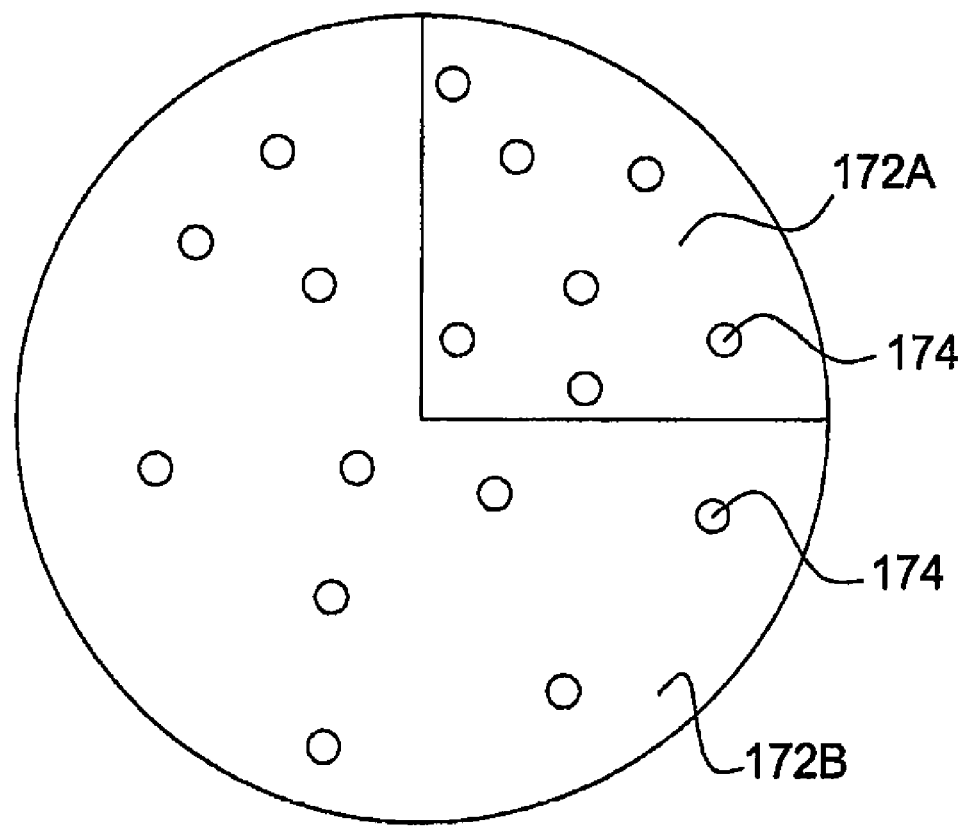
FIG. 4 is a schematic illustration of a top view of another embodiment of the shield.

The examples shown in FIGS. 2-3 are meant primarily for illustrative purposes, and it is understood that many different variations are possible, including combinations of zone configurations (e.g., sizes, shapes, open areas, materials and/or bias) that are designed to tailor to specific mask patterns so that process characteristics can be customized to suit specific needs. For example, if a mask has regions of different pattern densities or loading, the desired etch rates for these regions may be different from each other. In that case, it is possible to configure the zones or segments on the shield plate 172 based on the specific mask patterns in order to achieve the desired etch result. FIG. 4 illustrates a top view of one embodiment of plate 172 divided into zones 172A and 172B, whose spatial configurations correspond to or correlate with respective regions on a mask having different pattern densities. For example, if zone 172A corresponds to a region on the mask requiring a relatively high etch rate than the rest of the mask, zone 172A may be provided with larger diameter apertures to provide for a higher ratio of ions to neutral species. Alternatively, zones 172A and 172B may be made of materials with different dielectric constants and/or biased differently such that the amount of ions (or ion to neutral ratio) passing through zone 172A can be increased relatively to zone 172B. By providing zones made of materials with different dielectric constants and/or different biases, better control of the ion to neutral species ratio can be obtained compared to that obtained by varying the aperture size alone.

The height at which the ion-radical shield 170 is supported may vary to further control the etch process. The closer the ion-radical shield 170 is located to the ceiling 108, the smaller the upper process volume 178, which tends to promote a more stable plasma. In one embodiment, the ion-radical shield 170 is disposed approximately 1 inch (2.54 cm) from the ceiling 108. A faster etch rate may be obtained by locating the ion-radical shield 170 closer to the pedestal 124 and, therefore, the substrate 122. Alternatively, a lower, but more controlled, etch rate may be obtained by locating the ion-radical shield 170 farther from the pedestal 124. Controlling the etch rate by adjusting the height of the ion-radical shield 170 thus allows balancing faster etch rates with improved critical dimension uniformity and reduced etch bias. In one embodiment, the ion-radical shield 170 is disposed approximately 2 inches (5 cm) from the pedestal 124. The height of the Ion-radical shield 170 may range from about 1.5 inches (3.81 cm) to about 4 inches (10.16 cm) in a chamber having a distance of about 6 inches (15.24 cm) between the substrate 122 and the ceiling 108. It is contemplated that the ion-radical shield 170 may be positioned at different heights in chambers having different geometries, for example, larger or smaller chambers.

The legs 176, which support the plate 172 in a spaced-apart relationship with respect to the substrate 122, are generally located around an outer perimeter of the pedestal 124 or the edge ring 126 and may be fabricated of the same materials as the plate 172. In one embodiment, three legs 176 are used to support the ion-radical shield 170. Although the legs 176 generally maintain the plate 172 in a substantially parallel orientation relative to the substrate 122 or pedestal 124, it is contemplated that an angled orientation may be used by having legs 176 of varied lengths.

The legs 176 may be press fit at their upper ends into corresponding holes formed in the plate 172, or they may be threaded into the plate 172 or into brackets secured to an underside of the plate 172. The legs 176 may rest on the pedestal 124, adapter 182, or the edge ring 126, or they may extend into receiving holes (not shown) formed in the pedestal 124, adapter 182, or edge ring 126. Other conventional fastening methods not inconsistent with processing conditions may also be used, such as by screwing, bolting, bonding, among others. When secured to the edge ring 126, the ion-radical shield 170 may be part of an easily-replaceable process kit for ease of use, maintenance, replacement, and the like. It is contemplated that the ion-radical shield 170 may be configured to be easily retrofitted in existing process chambers.

Alternatively, the plate 172 may be supported above the pedestal 124 by other means such as by using a bracket (not shown) attached to the wall 104 or other structure within the process chamber 102. Where the plate 172 is attached to the wall 104 or other structure of the process chamber 102, the plate 172 is generally insulated from any ground path such as the ground 106.

Prior to plasma etching, one or more process gases are provided to the process chamber 102 from a gas panel 120, e.g., through one or more inlets 116 (e.g., openings, injectors, nozzles, and the like) located above the substrate pedestal 124. In the embodiment of FIG. 1, the process gases are provided to the inlets 116 using an annular gas channel 118, which may be formed in the wall 104 or in gas rings (as shown) that are coupled to the wall 104. During an etch process, the process gases are ignited into a plasma by applying power from the plasma source 112 to the antenna 110.

The pressure in the chamber 102 is controlled using a throttle valve 162 and a vacuum pump 164. The temperature of the wall 104 may be controlled using liquid-containing conduits (not shown) that run through the wall 104. Typically, the chamber wall 104 is formed from a metal (e.g., aluminum, stainless steel, among others) and is coupled to an electrical ground 106. The process chamber 102 also comprises conventional systems for process control, internal diagnostic, end point detection, and the like. Such systems are collectively shown as support systems 154.

The controller 146 comprises a central processing unit (CPU) 150, a memory 148, and support circuits 152 for the CPU 150 and facilitates control of the components of the process chamber 102 and, as such, of the etch process, as discussed below in further detail. The controller 146 may be one of any form of general-purpose computer processor that can be used in an industrial setting for controlling various chambers and sub-processors. The memory, or computer-readable medium, 642 of the CPU 150 may be one or more of readily available memory such as random access memory (RAM), read only memory (ROM), floppy disk, hard disk, or any other form of digital storage, local or remote. The support circuits 152 are coupled to the CPU 150 for supporting the processor in a conventional manner. These circuits include cache, power supplies, clock circuits, input/output circuitry and subsystems, and the like. The inventive method is generally stored in the memory 148 as a software routine. Alternatively, such software routine may also be stored and/or executed by a second CPU (not shown) that is remotely located from the hardware being controlled by the CPU 150.

Figure 5:
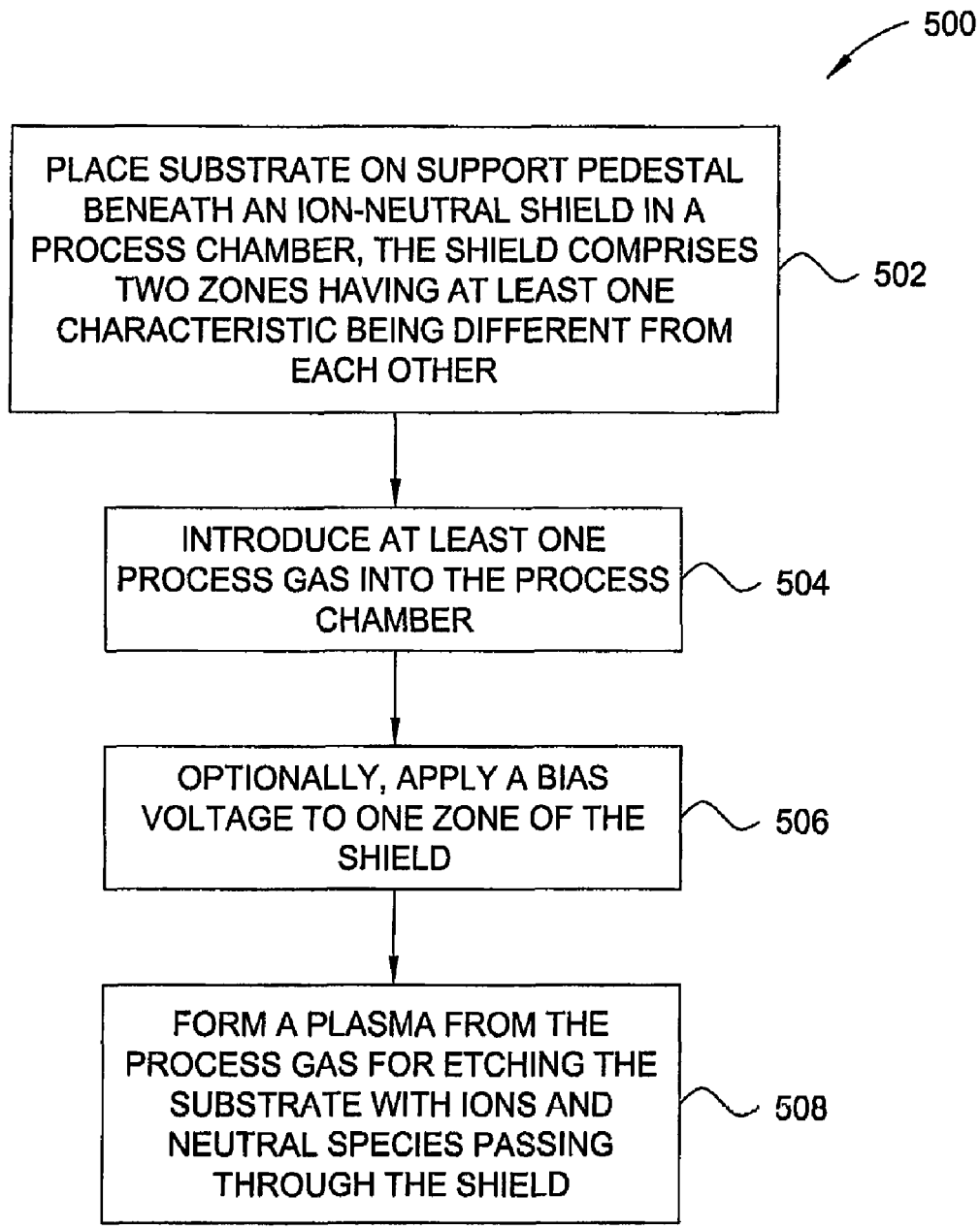
FIG. 5 is a flow chart of a method of etching a photomask according to one embodiment of the invention.

FIG. 5 illustrates a method 500 for etching a photomask substrate in an etch chamber having an ion-radical shield according to embodiments of the present invention. The method 500 begins at step 502 when the substrate is placed on a support pedestal beneath the ion-radical shield in a process chamber. The shield comprises two zones having at least one characteristic, e.g., material or potential bias, being different from each other. Typical substrates generally comprise an optically transparent silicon based material, such as quartz (i.e., silicon dioxide, $SiO_2$), having an opaque light-shielding layer of metal disposed on the surface of the quartz. Typical metals used in a photomask include chromium or chromium oxynitride. The substrate may also include a layer of silicon nitride (SiN) doped with molybdenum (Mo) interposed between the quartz and chromium.

At step 504, one or more process gases are introduced into the process chamber through a gas inlet. Exemplary process gases may include oxygen ($O_2$) or an oxygen-containing gas, such as carbon monoxide (CO), and/or a halogen-containing gas, such as a chlorine-containing gas for etching the metal layer. The processing gas may further include an inert gas or another oxygen-containing gas. Carbon monoxide is advantageously used to form passivating polymer deposits on the surfaces, particularly the sidewalls, of openings and patterns formed in a patterned resist material and etched metal layers. Chlorine-containing gases are selected from the group of chlorine ($Cl_2$), silicon tetrachloride ($SiCl_4$), boron trichloride ($BCl_3$), and combinations thereof, and are used to supply reactive radicals to etch the metal layer.

For example, $Cl_2$ may be provided at a rate of 10 to 1000 standard cubic centimeters per minute (sccm), and $O_2$ may be provided at a rate of 0 to 1000 sccm. A substrate bias power between 5 and 500 W can be applied to the electrostatic chuck and the substrate maintained at a temperature below about 150° C. The pressure in the process chamber can be controlled between about 1 and about 40 mTorr. In other embodiments such as those for etching quartz or MoSi, the process gases may comprise a fluorine-containing gas, e.g., trifluoromethane ($CHF_3$), tetrafluoromethane ($CF_4$), among others.

At step 506, optionally, a DC bias voltage is applied to at least one zone of the ion-radical shield. At step 508, a plasma is formed from the one or more process gases in a process volume above the ion-radical shield, for example, by applying RF power between about 200 to about 2000 W from a plasma power source to an antenna. Ions and neutral species from the plasma pass through the ion-radical shield according to a distribution pattern determined by the potentials established by the applied bias voltage and the plasma across the ion-radical shield. The substrate is etched by the ions and neutral species in the lower process volume.

While the foregoing is directed to embodiments of the present invention, other and further embodiments of the invention may be devised without departing from the basic scope thereof, and the scope thereof is determined by the claims that follow.

The invention claimed is:

1. An apparatus for plasma etching, comprising:
a process chamber;
    a support pedestal disposed in the process chamber and configured to receive a photomask thereon;
    an RF power source for forming a plasma within the chamber; and
    a planar shield disposed in the chamber above the pedestal, the planar shield comprising a plate having a plurality of apertures and configured to control the distribution of charged and neutral species passing through the plate, wherein the plate comprises two separate adjacent zones, each zone having apertures and having at least one characteristic different from one each other, the at least one characteristic being the material, wherein each of two separate zones comprises a material with a dielectric constant different from each other, the material being selected from the group consisting of anodized aluminum, ceramics, alumina, yttria, materials having a dielectric constant higher than about 4.

2. The apparatus of claim 1, wherein the two separate adjacent zones are characterized by two open areas that are different from each other, the two open areas being defined by one or more apertures from the plurality of apertures.

3. The apparatus of claim 1, wherein the plate further comprises zones arranged in at least one of a wedge, concentric ring, or grid pattern.

4. The apparatus of claim 1, wherein the two separate adjacent zones have spatial configurations that correlate with respective regions on the photomask characterized by different pattern densities.

* * * * *

UNITED STATES PATENT AND TRADEMARK OFFICE
CERTIFICATE OF CORRECTION

PATENT NO.         : 7,909,961 B2                                             Page 1 of 1
APPLICATION NO.    : 11/554495
DATED              : March 22, 2011
INVENTOR(S)        : Kumar et al.

It is certified that error appears in the above-identified patent and that said Letters Patent is hereby corrected as shown below:

In the Claims:

Column 10, Claim 1, Line 21, please insert --the-- after of.

Signed and Sealed this
Twenty-eighth Day of June, 2011

David J. Kappos
*Director of the United States Patent and Trademark Office*